United States Patent
Kim et al.

(10) Patent No.: US 11,560,495 B2
(45) Date of Patent: Jan. 24, 2023

(54) CMP SLURRY COMPOSITION FOR POLISHING TUNGSTEN PATTERN WAFER AND METHOD OF POLISHING TUNGSTEN PATTERN WAFER USING THE SAME

(71) Applicant: SAMSUNG SDI CO., LTD., Yongin-si (KR)

(72) Inventors: Won Jung Kim, Suwon-si (KR); Yoon Young Koo, Suwon-si (KR); Tae Won Park, Suwon-si (KR); Eui Rang Lee, Suwon-si (KR); Jong Won Lee, Suwon-si (KR); Youn Jin Cho, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 0 days.

(21) Appl. No.: 17/155,366

(22) Filed: Jan. 22, 2021

(65) Prior Publication Data
US 2021/0230451 A1 Jul. 29, 2021

(30) Foreign Application Priority Data
Jan. 23, 2020 (KR) .......................... 10-2020-0009406

(51) Int. Cl.
*C09G 1/02* (2006.01)
*C09G 1/18* (2006.01)
*H01L 21/3213* (2006.01)

(52) U.S. Cl.
CPC .................. *C09G 1/02* (2013.01); *C09G 1/18* (2013.01); *H01L 21/3213* (2013.01)

(58) Field of Classification Search
None
See application file for complete search history.

(56) References Cited

U.S. PATENT DOCUMENTS

| | | | | |
|---|---|---|---|---|
| 9,567,491 | B2 * | 2/2017 | Fu | H01L 21/3212 |
| 2009/0260297 | A1 * | 10/2009 | Seth | F21V 7/04 |
| | | | | 51/295 |
| 2016/0237315 | A1 * | 8/2016 | Stender | C09G 1/02 |

FOREIGN PATENT DOCUMENTS

| | | |
|---|---|---|
| CN | 101802125 A | 8/2010 |
| CN | 102093820 A | 6/2011 |
| CN | 102408837 A | 4/2012 |
| CN | 102762684 A | 10/2012 |
| CN | 104745082 A | 7/2015 |
| CN | 105143390 A | 12/2015 |
| CN | 105983441 A | 10/2016 |
| CN | 106103638 A | 11/2016 |
| CN | 106103639 A | 11/2016 |
| CN | 106104763 A | 11/2016 |
| CN | 106133881 A | 11/2016 |
| CN | 106661430 A | 5/2017 |
| CN | 107075347 A | 8/2017 |
| CN | 107112224 A | 8/2017 |
| CN | 109321140 A | 2/2019 |
| CN | 109593473 A | 4/2019 |
| KR | 10-2013-0007041 A | 1/2013 |
| KR | 10-2017-0076248 A | 7/2017 |
| TW | 201819299 A | 6/2018 |

OTHER PUBLICATIONS

Taiwanese Office action dated Jul. 23, 2021.
<J. Sep. Sci.> "Triamine-bonded stationary phase for open tubular capillary Electrochromatography", pp. 3184-3193 (Dec. 31, 2010).
Chinese Office Action dated Oct. 13, 2021.
Chinese Office action dated May 27, 2022.

* cited by examiner

*Primary Examiner* — Stephanie P Duclair
(74) *Attorney, Agent, or Firm* — Lee IP Law, P.C.

(57) ABSTRACT

A CMP slurry composition for polishing a tungsten pattern wafer and a method of polishing a tungsten pattern wafer, the composition including a solvent, the solvent including a polar solvent or a non-polar solvent; an abrasive agent; and an oxidizing agent, wherein the abrasive agent includes silica modified with an amino silane that includes three nitrogen atoms.

9 Claims, No Drawings

CMP SLURRY COMPOSITION FOR POLISHING TUNGSTEN PATTERN WAFER AND METHOD OF POLISHING TUNGSTEN PATTERN WAFER USING THE SAME

CROSS-REFERENCE TO RELATED APPLICATION

Korean Patent Application No. 10-2020-0009406, filed on Jan. 23, 2020, in the Korean Intellectual Property Office, and entitled: "CMP Slurry Composition for Polishing Tungsten Pattern Wafer and Method of Polishing Tungsten Pattern Wafer Using the Same," is incorporated by reference herein in its entirety.

BACKGROUND

1. Field

Embodiments relate to a CMP slurry composition for polishing a tungsten pattern wafer and a method of polishing a tungsten pattern wafer using the same.

2. Description of the Related Art

A chemical mechanical polishing (CMP) composition and a method of polishing (or flattening) a surface of a substrate have been considered. A polishing composition for polishing a metal layer (e.g., a tungsten layer) on a semiconductor substrate may include abrasive particles suspended in an aqueous solution and chemical accelerators, e.g., an oxidizing agent, a catalyst, and the like.

A process of polishing a metal layer using the CMP composition may include polishing only the metal layer, polishing the metal layer and a barrier layer, and polishing the metal layer, the barrier layer and an oxide layer.

SUMMARY

The embodiments may be realized by providing a CMP slurry composition for polishing a tungsten pattern wafer, the composition including a solvent, the solvent including a polar solvent or a non-polar solvent; an abrasive agent; and an oxidizing agent, wherein the abrasive agent includes silica modified with an amino silane that includes three nitrogen atoms.

The amino silane that includes three nitrogen atoms may include a compound of Formula 1, a cation derived from the compound of Formula 1, or a salt of the compound of Formula 1:

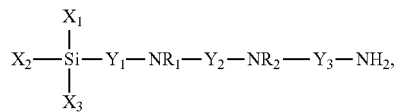

in Formula 1, $X_1$, $X_2$, and $X_3$ may be each independently a hydrogen atom, a hydroxyl group, a substituted or unsubstituted $C_1$ to $C_{20}$ alkyl group, a substituted or unsubstituted $C_6$ to $C_{20}$ aryl group, a substituted or unsubstituted $C_3$ to $C_{20}$ cycloalkyl group, a substituted or unsubstituted $C_7$ to $C_{20}$ arylalkyl group, a substituted or unsubstituted $C_1$ to $C_{20}$ alkoxy group, or a substituted or unsubstituted $C_6$ to $C_{20}$ aryloxy group, at least one of $X_1$, $X_2$, and $X_3$ is a hydroxyl group, a substituted or unsubstituted $C_1$ to $C_{20}$ alkoxy group, or a substituted or unsubstituted $C_6$ to $C_{20}$ aryloxy group; $Y_1$, $Y_2$, and $Y_3$ may be each independently a bivalent aliphatic hydrocarbon group, a bivalent alicyclic hydrocarbon group, or a bivalent aromatic hydrocarbon group; and $R_1$ and $R_2$ may be each independently a hydrogen atom, a hydroxyl group, a substituted or unsubstituted $C_1$ to $C_{20}$ monovalent aliphatic hydrocarbon group, a substituted or unsubstituted $C_3$ to $C_{20}$ monovalent alicyclic hydrocarbon group, or a substituted or unsubstituted $C_6$ to $C_{20}$ monovalent aromatic hydrocarbon group.

$Y_1$, $Y_2$, and $Y_3$ may be each independently a $C_1$ to $C_5$ alkylene group, and $R_1$ and $R_2$ may each be a hydrogen atom.

The compound of Formula 1 may include diethylenetriaminopropyltrimethoxysilane, diethylenetriaminopropyltriethoxysilane, diethylenetriaminopropylmethyldimethoxysilane, diethylenetriaminopropylmethyldiethoxysilane, or diethylenetriaminomethylmethyldiethoxysilane.

The amino silane that includes three nitrogen atoms may have a positive charge on a surface thereof and has a surface potential of about 10 mV to about 60 mV.

The composition may have a pH of about 3 to about 6.

The silica modified with the amino silane that includes three nitrogen atoms may have an average particle diameter (D50) of about 10 nm to about 200 nm.

The CMP slurry composition may further include a catalyst or an organic acid.

The composition may include about 0.001 wt % to about 20 wt % of the abrasive agent; about 0.01 wt % to about 20 wt % of the oxidizing agent; about 0.001 wt % to about 10 wt % of the catalyst; and about 0.001 wt % to about 20 wt % of the organic acid, all wt % being based on a total weight of the composition.

The embodiments may be realized by providing a method of polishing a tungsten pattern wafer, the method including polishing a tungsten pattern wafer using the CMP slurry composition according to an embodiment.

The amino silane that includes three nitrogen atoms may include a compound of Formula 1, a cation derived from the compound of Formula 1, or a salt of the compound of Formula 1:

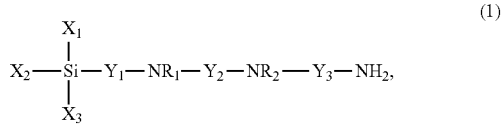

in Formula 1, $X_1$, $X_2$, and $X_3$ may be each independently a hydrogen atom, a hydroxyl group, a substituted or unsubstituted $C_1$ to $C_{20}$ alkyl group, a substituted or unsubstituted $C_6$ to $C_{20}$ aryl group, a substituted or unsubstituted $C_3$ to $C_{20}$ cycloalkyl group, a substituted or unsubstituted $C_7$ to $C_{20}$ arylalkyl group, a substituted or unsubstituted $C_1$ to $C_{20}$ alkoxy group, or a substituted or unsubstituted $C_6$ to $C_{20}$ aryloxy group, at least one of $X_1$, $X_2$, and $X_3$ is a hydroxyl group, a substituted or unsubstituted $C_1$ to $C_{20}$ alkoxy group, or a substituted or unsubstituted $C_6$ to $C_{20}$ aryloxy group; $Y_1$, $Y_2$, and $Y_3$ may be each independently a bivalent aliphatic hydrocarbon group, a bivalent alicyclic hydrocarbon group, or a bivalent aromatic hydrocarbon group; and $R_1$ and $R_2$ may be each independently a hydrogen atom, a hydroxyl group, a substituted or unsubstituted $C_1$ to $C_{20}$ monovalent aliphatic hydrocarbon group, a substituted or unsubstituted $C_3$ to $C_{20}$ monovalent alicyclic hydrocarbon group, or a substituted or unsubstituted $C_6$ to $C_{20}$ monovalent aromatic hydrocarbon group.

$Y_1$, $Y_2$, and $Y_3$ may be each independently a $C_1$ to $C_5$ alkylene group, and $R_1$ and $R_2$ may each be a hydrogen atom.

The compound of Formula 1 may include diethylenetriaminopropyltrimethoxysilane, diethylenetriaminopropyltriethoxysilane, diethylenetriaminopropylmethyldimethoxysilane, diethylenetriaminopropylmethyldiethoxysilane, or diethylenetriaminomethylmethyldiethoxysilane.

The amino silane that includes three nitrogen atoms may have a positive charge on a surface thereof and has a surface potential of about 10 mV to about 60 mV.

The composition may have a pH of about 3 to about 6.

The silica modified with the amino silane that includes three nitrogen atoms may have an average particle diameter (D50) of about 10 nm to about 200 nm.

The CMP slurry composition may further include a catalyst or an organic acid.

The composition may include about 0.001 wt % to about 20 wt % of the abrasive agent; about 0.01 wt % to about 20 wt % of the oxidizing agent; about 0.001 wt % to about 10 wt % of the catalyst; and about 0.001 wt % to about 20 wt % of the organic acid, all wt % being based on a total weight of the composition.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present.

As used herein, the term "substituted" in the term "substituted or unsubstituted" means that at least one hydrogen atom in a corresponding functional group is substituted with a hydroxyl group, a $C_1$ to $C_{10}$ alkyl group or halo-alkyl group, a $C_2$ to $C_{10}$ alkenyl group or halo-alkenyl group, a $C_2$ to $C_{10}$ alkynyl group or halo-alkynyl group, a $C_3$ to $C_{10}$ cycloalkyl group, a $C_3$ to $C_{10}$ cycloalkenyl group, a $C_6$ to $C_{10}$ aryl group, a $C_7$ to $C_{10}$ arylalkyl group, a $C_1$ to $C_{10}$ alkoxy group, a $C_6$ to $C_{10}$ aryloxy group, an amino group, a halo group, a cyano group, or a thiol group. As used herein, the term "or" is not an exclusive term, e.g., "A or B" would include A, B, or A and B.

Herein, "monovalent aliphatic hydrocarbon group" may be a substituted or unsubstituted $C_1$ to $C_{20}$ linear or branched alkyl group, e.g., a $C_1$ to $C_{10}$ alkyl group, or a $C_1$ to $C_5$ alkyl group.

Herein, "monovalent alicyclic hydrocarbon group" may be a substituted or unsubstituted $C_3$ to $C_{20}$ cycloalkyl group, e.g., a $C_3$ to $C_{10}$ cycloalkyl group, or a $C_3$ to $C_5$ cycloalkyl group.

Herein, "monovalent aromatic hydrocarbon group" may be a substituted or unsubstituted $C_6$ to $C_{20}$ aryl group or a substituted or unsubstituted $C_7$ to $C_{20}$ arylalkyl group, e.g., a $C_6$ to $C_{10}$ aryl group or a $C_7$ to $C_{10}$ arylalkyl group.

Herein, "bivalent aliphatic hydrocarbon group", "bivalent alicyclic hydrocarbon group" or "bivalent aromatic hydrocarbon group" means a modified bivalent group of the "monovalent aliphatic hydrocarbon group", the "monovalent alicyclic hydrocarbon group", or the "monovalent aromatic hydrocarbon group".

For example, the "bivalent aliphatic hydrocarbon group" may be a substituted or unsubstituted $C_1$ to $C_{20}$ linear or branched alkylene group, e.g., a $C_1$ to $C_{10}$ alkylene group, or a $C_1$ to $C_5$ alkylene group; the "bivalent alicyclic hydrocarbon group" may be a substituted or unsubstituted $C_3$ to $C_{20}$ cycloalkylene group, e.g., a $C_3$ to $C_{10}$ cycloalkylene group, or a $C_3$ to $C_5$ cycloalkylene group; and the "bivalent aromatic hydrocarbon group" may be a substituted or unsubstituted $C_7$ to $C_{20}$ arylalkylene group, e.g., a $C_6$ to $C_{10}$ arylene group, or a $C_7$ to $C_{10}$ arylalkylene group.

As used herein to represent a specific numerical range, "X to Y" is defined as "greater than or equal to X and less than or equal to Y".

A CMP slurry composition for polishing a tungsten pattern wafer, which includes an abrasive agent and an oxidizing agent and employs silica modified with an amino silane that includes or contains three nitrogen atoms as the abrasive agent, may help improve the polishing rate while reducing erosion upon polishing of the tungsten pattern wafer, thereby improving flatness of a polished surface of the tungsten pattern wafer without generating scratch defects. In addition, as the silica modified with the amino silane containing three nitrogen atoms may be used as the abrasive agent, the polishing rate and flatness of the polished surface can be improved upon polishing the tungsten pattern wafer in a sub-acidic condition, as compared with in a strongly acidic condition at pH 1 to 3.

A CMP slurry composition for polishing a tungsten pattern wafer according to an embodiment (hereinafter referred to as "CMP slurry composition") may include, e.g., a solvent (including a polar solvent or a non-polar solvent); an abrasive agent; and an oxidizing agent. In an implementation, the abrasive agent may include silica modified with an amino silane containing three nitrogen atoms.

Hereinafter, components of the CMP slurry composition according to the embodiment will be described in detail.

The polar solvent or non-polar solvent may help reduce friction upon polishing a tungsten pattern wafer with an abrasive agent. The solvent may include water (e.g., ultrapure water or deionized water), an organic amine, an organic alcohol, an organic alcohol amine, an organic ether, an organic ketone, or the like. In an implementation, ultrapure water or deionized water is used. In an implementation, the solvent may be included in a balance amount in the CMP slurry composition.

The abrasive agent may polish an insulating layer (e.g., a silicon oxide layer) and a tungsten pattern wafer at a high polishing rate.

The abrasive agent, e.g., silica modified with an amino silane containing three nitrogen atoms, may include spherical or non-spherical particles, in which primary particles have an average particle diameter (D50) of about 10 nm to about 200 nm (e.g., 10 nm, 20 nm, 30 nm, 40 nm, 50 nm, 60 nm, 70 nm, 80 nm, 90. 100 nm, 110 nm, 120 nm, 130 nm, 140 nm, 150 nm, 160 nm, 170 nm, 180 nm, 190 nm, or 200 nm). In an implementation, the average particle diameter (D50) may be about 20 nm to about 180 nm, or about 40 nm to about 130 nm. Within this range, the CMP slurry composition may help secure a sufficient polishing rate for the insulating layer and the tungsten pattern wafer, which are polishing targets, without generating surface defects (e.g., scratches and the like) after polishing.

The "average particle diameter (D50)" means the diameter of particles corresponding to 50 wt % in a weight distribution of the abrasive agent.

In the CMP slurry composition, the abrasive agent, e.g., the silica modified with an amino silane containing three nitrogen atoms, may be present in an amount of about 0.001 wt % to about 20 wt % (e.g., 0.001 wt %, 0.002 wt %, 0.003 wt %, 0.004 wt %, 0.005 wt %, 0.006 wt %, 0.007 wt %, 0.008 wt %, 0.009 wt %, 0.01 wt %, 0.02 wt %, 0.03 wt %, 0.04 wt %, 0.05 wt %, 0.06 wt %, 0.07 wt %, 0.08 wt %, 0.09 wt %, 0.1 wt %, 0.2 wt %, 0.3 wt %, 0.4 wt %, 0.5 wt %, 0.6 wt %, 0.7 wt %, 0.8 wt %, 0.9 wt %, 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, or 20 wt %), based on a total weight of the composition. In an implementation, the silica modified with an amino silane containing three nitrogen atoms may be present in an amount of, e.g., about 0.01 wt % to about 10 wt %, about 0.05 wt % to about 5 wt %, or about 0.5 wt % to about 3 wt %. Within this range, the CMP slurry composition may help secure a sufficient polishing rate of the insulating layer and the tungsten pattern wafer while securing slurry dispersion stability without generating scratches.

The abrasive agent may include the silica modified with an amino silane containing three nitrogen atoms.

Non-modified silica or silica modified with an amino silane containing fewer than three nitrogen atoms may provide a low polishing rate of the tungsten pattern wafer or insignificant effects on improvement of flatness. On the contrary, the silica modified with the amino silane containing three nitrogen atoms may help provide very good effects on improvement in polishing rate and flatness of the tungsten pattern wafer. In an implementation, the silica modified with the amino silane containing three nitrogen atoms may provide very good effects in improvement in polishing rate of the tungsten pattern wafer and flatness of a polished surface thereof upon polishing in a sub-acidic condition, as compared with in a strongly acidic condition.

The silica modified with the amino silane containing three nitrogen atoms may have a positive charge on a surface thereof and may have a surface potential of about 10 mV to 60 mV (e.g., 10 mV, 20 mV, 30 mV, 40 mV, 50 mV, or 60 mV). Within this range, the composition can achieve improvement in flatness without generating surface defects after polishing.

In an implementation, silica may be modified with the amino silane containing three nitrogen atoms described below.

In an implementation, the amino silane containing three nitrogen atoms may include, e.g., a compound represented by Formula 1, a cation derived from the compound of Formula 1, or a salt of the compound of Formula 1.

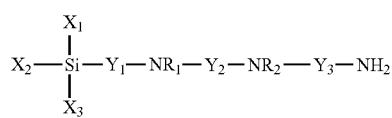

(1)

In Formula 1, $X_1$, $X_2$, and $X_3$ may each independently be or include, e.g., a hydrogen atom, a hydroxyl group, a substituted or unsubstituted $C_1$ to $C_{20}$ alkyl group, a substituted or unsubstituted $C_6$ to $C_{20}$ aryl group, a substituted or unsubstituted $C_3$ to $C_{20}$ cycloalkyl group, a substituted or unsubstituted $C_7$ to $C_{20}$ arylalkyl group, a substituted or unsubstituted $C_1$ to $C_{20}$ alkoxy group, or a substituted or unsubstituted $C_6$ to $C_{20}$ aryloxy group. In an implementation, at least one of $X_1$, $X_2$, and $X_3$ may be, e.g., a hydroxyl group, a substituted or unsubstituted $C_1$ to $C_{20}$ alkoxy group, or a substituted or unsubstituted $C_6$ to $C_{20}$ aryloxy group.

$Y_1$, $Y_2$, and $Y_3$ may each independently be or include, e.g., a bivalent aliphatic hydrocarbon group, a bivalent alicyclic hydrocarbon group, or a bivalent aromatic hydrocarbon group.

$R_1$ and $R_2$ may each independently be or include, e.g., a hydrogen atom, a hydroxyl group, a substituted or unsubstituted $C_1$ to $C_{20}$ monovalent aliphatic hydrocarbon group, a substituted or unsubstituted $C_3$ to $C_{20}$ monovalent alicyclic hydrocarbon group, or a substituted or unsubstituted $C_6$ to $C_{20}$ monovalent aromatic hydrocarbon group.

In an implementation, in Formula 1, $X_1$, $X_2$, and $X_3$ may each independently be or include, e.g., a hydroxyl group, a substituted or unsubstituted $C_1$ to $C_{20}$ alkyl group, or a substituted or unsubstituted $C_1$ to $C_{20}$ alkoxy group, and at least one of $X_1$, $X_2$, and $X_3$ may be a hydroxyl group or a substituted or unsubstituted $C_1$ to $C_{20}$ alkoxy group. In an implementation, in Formula 1, $X_1$, $X_2$, and $X_3$ may each independently be or include, e.g., a hydroxyl group or a substituted or unsubstituted $C_1$ to $C_{20}$ alkoxy group.

In an implementation, $Y_1$, $Y_2$, and $Y_3$ may each independently be or include, e.g., a bivalent aliphatic hydrocarbon group, e.g., a $C_1$ to $C_5$ alkylene group.

In an implementation, in Formula 1, $R_1$ and $R_2$ may each be a hydrogen atom.

In an implementation, the compound of Formula 1 may include, e.g., diethylenetriaminopropyltrimethoxysilane, diethylenetriaminopropyltriethoxysilane, diethylenetriaminopropylmethyldimethoxysilane, diethylenetriaminopropylmethyldiethoxysilane, or diethylenetriaminomethylmethyldiethoxysilane.

In an implementation, the abrasive agent may include silica modified with a cation derived from the compound of Formula 1.

The cation derived from the compound of Formula 1 means a cation formed by coupling a hydrogen atom or a substituent to at least one of three nitrogen atoms in the compound of Formula 1. The cation may include a monovalent to trivalent cation. In an implementation, the cation may be represented by at least one of Formula 1-1 to Formula 1-7.

[Formula 1-1]

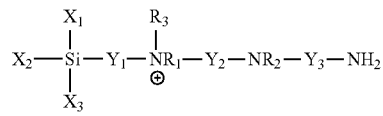

[Formula 1-2]

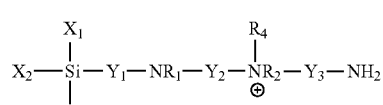

[Formula 1-3]

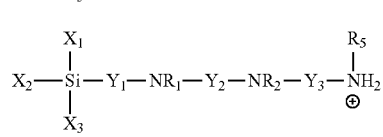

[Formula 1-4]

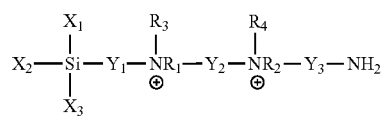

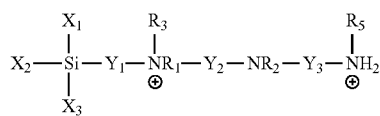

[Formula 1-5]

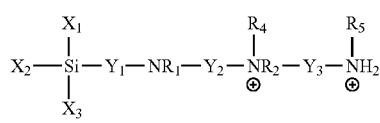

[Formula 1-6]

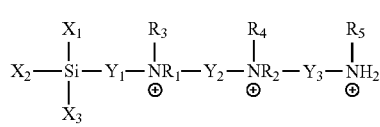

[Formula 1-7]

In Formulae 1-1 to 1-7, $X_1$, $X_2$, $X_3$, $Y_1$, $Y_2$, $Y_3$, $R_1$, and $R_2$ may be defined the same as those of Formula 1.

$R_3$, $R_4$, and $R_5$ may each independently be or include, e.g., a hydrogen atom, a hydroxyl group, a substituted or unsubstituted $C_1$ to $C_{20}$ monovalent aliphatic hydrocarbon group, a substituted or unsubstituted $C_3$ to $C_{20}$ monovalent alicyclic hydrocarbon group, or a substituted or unsubstituted $C_6$ to $C_{20}$ monovalent aromatic hydrocarbon group.

In an implementation, the abrasive agent may include silica modified with a salt of the compound of Formula 1.

The cation (of the salt) may be represented by at least one of Formula 1-1 to Formula 1-7. The anion (of the salt) may include a halogen anion (e.g.: $F^-$, $Cl^-$, $Br^-$, or $I^-$); an organic acid anion, such as a carbonic anion (e.g.: $CO_3^{2-}$, $HCO_3^-$), an acetic anion ($CH_3COO^-$), a citric anion ($HOC(COO^-)(CH_2COO^-)_2$), or the like; a nitrogen-containing anion (e.g.: $NO_3^-$, $NO_2^-$); a phosphorus-containing anion (e.g.: $PO_4^{3-}$, $HPO_4^{2-}$, $H_2PO_4^-$); a sulfur-containing anion (e.g.: $SO_4^{2-}$, $HSO_4^-$); an inorganic acid anion, such as cyanide anions ($CN^-$), or the like.

Modification of silica with the compound represented by Formula 1, the cation derived from the compound of Formula 1, or the salt of the compound of Formula 1 may be performed by reacting non-modified silica with a predetermined compound, cation, or salt for modification of the silica for a predetermined period of time. In an implementation, the non-modified silica may include, e.g., colloidal silica and fumed silica. In an implementation, the non-modified silica may include, e.g., colloidal silica.

The oxidizing agent may oxidize the tungsten pattern wafer to facilitate polishing of the tungsten pattern wafer.

The oxidizing agent may include, e.g., an inorganic percompound, an organic percompound, bromic acid or salts thereof, nitric acid or salts thereof, chloric acid or salts thereof, chromic acid or salts thereof, iodic acid or salts thereof, iron or salts thereof, copper or salts thereof, rare earth metal oxides, transition metal oxides, or potassium dichromate. Here, the percompound refers to a compound that contains at least one peroxidation or peroxide group (—O—O—) or an element in the highest oxidation state. In an implementation, the oxidizing agent is a percompound. In an implementation, the percompund may include, e.g., hydrogen peroxide, potassium periodide, calcium persulfate, or potassium ferricyanide. In an implementation, the percompund may include, e.g., hydrogen peroxide.

In the CMP slurry composition, the oxidizing agent may be present in an amount of about 0.01 wt % to about 20 wt % (e.g., 0.01 wt %, 0.02 wt %, 0.03 wt %, 0.04 wt %, 0.05 wt %, 0.06 wt %, 0.07 wt %, 0.08 wt %, 0.09 wt %, 0.1 wt %, 0.2 wt %, 0.3 wt %, 0.4 wt %, 0.5 wt %, 0.6 wt %, 0.7 wt %, 0.8 wt %, 0.9 wt %, 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, or 20 wt %), based on the total weight of the composition. In an implementation, the oxidizing agent may be present in an amount of, e.g., about 0.05 wt % to about 10 wt %, or about 0.1 wt % to about 5 wt %. Within this range, the CMP slurry composition may help improve the polishing rate of the tungsten pattern wafer.

In an implementation, the CMP slurry composition may further include, e.g., a catalyst or an organic acid.

In an implementation, the CMP slurry composition may further include, e.g., an iron ion compound, a complex compound of iron ions, or a hydrate thereof, as the catalyst.

The iron ion compound, the complex compound of iron ions, and the hydrate thereof may help improve a polishing rate of a tungsten metal layer.

The iron ion compound may include an iron trivalent cation-containing compound. The iron trivalent cation-containing compound may include a compound having iron trivalent cations, which are present as free cations in an aqueous solution. In an implementation, the iron trivalent cation-containing compound may include, e.g., iron chloride ($FeCl_3$), iron nitrate ($Fe(NO_3)_3$), or iron sulfate ($Fe_2(SO_4)_3$).

The complex compound of iron ions may include an iron trivalent cation-containing complex compound. The iron trivalent cation-containing complex compound may include a compound formed by reacting an iron trivalent cation with an organic or inorganic compound having at least one functional group (e.g., carboxylic acids, phosphoric acids, sulfuric acids, amino acids, or amines) in an aqueous solution. The organic or inorganic compound may include, e.g., citrate, ammonium citrate, p-toluene sulfonic acid (pTSA), 1,3-propylenediaminetetraacetic acid (PDTA), ethylenediaminetetraacetic acid (EDTA), diethylenetriaminepentaacetic acid (DTPA), nitrilotriacetic acid (NTA), or ethylenediamine-N,N'-disuccinic acid (EDDS). In an implementation, the iron trivalent cation-containing compound may include, e.g., ferric citrate, ferric ammonium citrate, Fe(III)-pTSA, Fe(III)-PDTA, or Fe(III)-EDTA.

In the CMP slurry composition, the catalyst, e.g., the iron ion compound, the complex compound of iron ions, or the hydrate thereof, may be present in an amount of about 0.001 wt % to about 10 wt % (e.g., 0.001 wt %, 0.002 wt %, 0.003 wt %, 0.004 wt %, 0.005 wt %, 0.006 wt %, 0.007 wt %, 0.008 wt %, 0.009 wt %, 0.01 wt %, 0.02 wt %, 0.03 wt %, 0.04 wt %, 0.05 wt %, 0.06 wt %, 0.07 wt %, 0.08 wt %, 0.09 wt %, 0.1 wt %, 0.2 wt %, 0.3 wt %, 0.4 wt %, 0.5 wt %, 0.6 wt %, 0.7 wt %, 0.8 wt %, 0.9 wt %, 1 wt %, 2 wt %, 3 wt %, 4 wt %, 5 wt %, 6 wt %, 7 wt %, 8 wt %, 9 wt %, or 10 wt %), based on the total weight of the composition. In an implementation, the catalyst may be present in an amount of, e.g., about 0.001 wt % to about 5 wt %, about 0.001 wt % to about 1 wt %, or about 0.001 wt % to about 0.5 wt %. Within this range, the CMP slurry composition may help improve the polishing rate of the tungsten metal layer.

The organic acid may include a polycarboxylic acid, such as malonic acid, maleic acid, malic acid, or the like, or an amino acid, such as glycine, isoleucine, leucine, phenylalanine, methionine, threonine, tryptophan, valine, alanine, arginine, cysteine, glutamine, histidine, proline, serine, tyrosine, lysine, or the like.

In the CMP slurry composition, the organic acid may be present in an amount of about 0.001 wt % to about 20 wt % (e.g., 0.001 wt %, 0.002 wt %, 0.003 wt %, 0.004 wt %, 0.005 wt %, 0.006 wt %, 0.007 wt %, 0.008 wt %, 0.009 wt %, 0.01 wt %, 0.02 wt %, 0.03 wt %, 0.04 wt %, 0.05 wt %, 0.06 wt %, 0.07 wt %, 0.08 wt %, 0.09 wt %, 0.1 wt %, 0.2 wt %, 0.3 wt %, 0.4 wt %, 0.5 wt %, 0.6 wt %, 0.7 wt %, 0.8 wt %, 0.9 wt %, 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, or 20 wt %), based on the total weight of the composition. In an implementation, the organic acid may be present in an amount of, e.g., about 0.01 wt % to about 10 wt %, about 0.01 wt % to about 5 wt %, or about 0.01 wt % to about 1 wt %. Within this range, the CMP slurry composition may help suppress erosion and protrusion upon polishing the tungsten pattern wafer.

The CMP slurry composition may have a pH of about 3 to about 6 (e.g., 3, 4, 5, or 6), about 4 to 6, or about 5 to 6. Within this range, the CMP slurry composition containing the modified silica as the abrasive agent may help realize a high polishing rate of the tungsten pattern wafer upon polishing in a sub-acidic pH condition, as compared with in a strongly acidic condition.

The CMP slurry composition may further include a pH regulator to help maintain a suitable pH value.

The pH regulator may include, e.g., inorganic acids, such as nitric acid, phosphoric acid, hydrochloric acid, or sulfuric acid, or organic acids, such as organic acids having a pKa value of about 6 or less, e.g., acetic acid or phthalic acid. In an implementation, the pH regulator may include a base, e.g., an ammonia solution, sodium hydroxide, potassium hydroxide, ammonium hydroxide, sodium carbonate, or potassium carbonate.

The CMP slurry composition may further include an additive, e.g., biocides, surfactants, dispersants, modifiers, surface active agents, or the like. In the CMP slurry composition, the additives may be present in an amount of about 0.001 wt % to about 5 wt %, e.g., about 0.001 wt % to about 1 wt %, or about 0.001 wt % to about 0.5 wt %. Within this range, the additives can realize effects thereof without affecting the polishing rate.

A method of polishing a tungsten pattern wafer according to an embodiment may include polishing a tungsten pattern wafer using the CMP slurry composition described above.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Details of components used in Examples and Comparative Examples are as follows.

(1) Non-modified abrasive agent: Colloidal silica having an average particle diameter (D50) of 120 nm (PL-7, Fuso Chemical Industries)

(2) pH regulator: nitric acid or ammonia solution

Example 1

In terms of solid content of the non-modified abrasive agent, 0.04 mmol of a compound of Formula 2 was mixed with the non-modified abrasive agent and reacted under conditions of pH 2.5 at 25° C. for 72 hours, thereby preparing silica (average particle diameter (D50): 125 nm) modified with the compound of Formula 2.

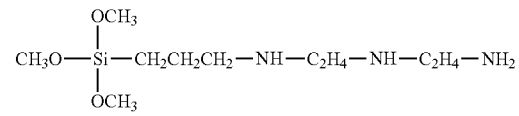

[Formula 2]

A CMP slurry composition was prepared by mixing 1.5 wt % of the modified silica as an abrasive agent, 0.3 wt % of hydrogen peroxide as an oxidizing agent, 0.001 wt % of ethylenediaminetetraacetic acid diammonium salt, 0.001 wt % of iron nitrate as an iron ion-containing compound, 0.03 wt % of malonic acid and 0.15 wt % of glycine as organic acids, and a balance of deionized water as a solvent, based on the total weight of the CMP slurry composition. The CMP slurry composition was regulated to a pH of 5.5 using the pH regulator.

Example 2

A CMP slurry composition was prepared in the same manner as in Example 1 except that the content of hydrogen peroxide was changed to 0.15 wt %.

Example 3

A CMP slurry composition was prepared in the same manner as in Example 1 except that pH of the CMP slurry composition was regulated to 5.0 using the pH regulator.

Comparative Example 1

A CMP slurry composition was prepared in the same manner as in Example 1 except that the non-modified abrasive agent was used.

Comparative Example 2

In terms of solid content of the non-modified abrasive agent, 0.04 mmol of 3-amionopropyltriethoxysilane was mixed with the non-modified abrasive agent and reacted under conditions of pH 2.5 at 25° C. for 72 hours, thereby preparing silica (average particle diameter (D50): 125 nm) modified with 3-amionopropyltriethoxysilane. A CMP slurry composition was prepared in the same manner as in Example 1 using the modified silica.

Comparative Example 3

In terms of solid content of the non-modified abrasive agent, 0.04 mmol of a compound of Formula 3 was mixed with the non-modified abrasive agent and reacted under conditions of pH 2.5 at 25° C. for 72 hours, thereby preparing silica (average particle diameter (D50): 125 nm) modified with the compound of Formula 3. A CMP slurry composition was prepared in the same manner as in Example 1 using the modified silica.

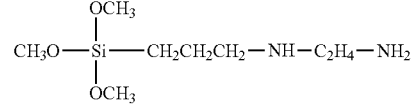

[Formula 3]

Comparative Example 4

A CMP slurry composition was prepared in the same manner as in Example 1 except that the oxidizing agent was not used.

Polishing evaluation was carried out on the CMP slurry compositions prepared in the Examples and the Comparative Examples under the following polishing conditions. Results are shown in Table 1.

[Polishing Evaluation Condition]
1. Polishing machine: Reflexion 300 mm (AMAT Co., Ltd.)
2. Polishing condition
Polishing pad: VP3100/Rohm and Haas Company layer was calculated based on difference in film thickness before and after polishing under the above polishing conditions, in which the difference in film thickness was measured using a reflectometer.

Flatness (erosion, unit: Å): After polishing a wafer using each of the CMP slurry compositions prepared in the examples and the comparative examples under the above polishing conditions, a profile of a pattern was measured using Insight CAP Compact Atomic Profiler (Bruker Co., Ltd.). Erosion was calculated based on difference in height between peri-oxide and cell-oxide in a 0.18/0.18 μm pattern region of the polished wafer. A scanning speed was set to 100 μm/sec and a scan length was set to 2 mm.

TABLE 1

| | | Example | | | Comparative Example | | | |
|---|---|---|---|---|---|---|---|---|
| | | 1 | 2 | 3 | 1 | 2 | 3 | 4 |
| Abrasive agent | Kind | Modified silica [a] | Modified silica [a] | Modified silica [a] | Non-modified silica | Modified Silica [b] | Modified Silica [c] | Modified Silica [a] |
| | Content | 1.5 | 1.5 | 1.5 | 1.5 | 1.5 | 1.5 | 1.5 |
| Hydrogen peroxide | | 0.3 | 0.15 | 0.3 | 0.3 | 0.3 | 0.3 | 0 |
| pH | | 5.5 | 5.5 | 5.0 | 5.5 | 5.5 | 5.5 | 5.5 |
| Polishing rate of tungsten metal layer | | 30 | 15 | 30 | 10 | 10 | 30 | 5 |
| Polishing rate of insulating layer | | 120 | 120 | 100 | 5 | 10 | 120 | 10 |
| Flatness | | 150 | 200 | 180 | 600 | 550 | 300 | 550 |

*In Table 1,
① Modified silica
[a] silica modified with compound of Formula 2
② Modified silica
[b] silica modified with 3-aminopropyltriethoxysilane
③ Modified silica
[c] silica modified with compound of Formula 3

Head speed: 35 rpm
Platen speed: 33 rpm
Pressure: 1.5 psi
Retainer Ring Pressure: 8 psi
Slurry flow rate: 250 ml/min
Polishing time: 60 sec
3. Polishing target
A commercially available tungsten pattern wafer (MIT 854, 300 mm)
A mixture was prepared by mixing a CMP slurry for tungsten polishing (STARPLANAR7000, Samsung SDI Co., Ltd.) with deionized in a weight ratio of 1:2 and hydrogen peroxide was added to the mixture in an amount of 2 wt % based on the weight of the mixture, thereby preparing a mixed solution, which in turn was used to polish a tungsten pattern wafer. The tungsten pattern wafer was polished on a polishing machine (Reflexion LK300 mm) using an IC1010/SubaIV Stacked polishing pad (Rodel Co., Ltd.) under conditions of a head speed of 101 rpm, a platen speed of 33 rpm, a polishing pressure of 2 psi, a retainer ring pressure of 8 psi, and a mixed solution flow rate of 250 ml/min. Polishing was performed to remove a tungsten metal layer until oxide/metal patterns were exposed.
4. Analysis method
Polishing rate (unit: Å/min): A polishing rate of the tungsten metal layer was obtained based on electric resistance corresponding to difference in film thickness before and after polishing in evaluation under the above polishing conditions. A polishing rate of an insulating As shown in Table 1, in the slurry composition according to Examples, viz., the slurry compositions including both the oxidizing agent and silica modified with an amino silane that included three nitrogen atoms, exhibited improvement in polishing rate and flatness of the tungsten pattern wafer.

On the contrary, the composition of Comparative Example 1 (containing non-modified silica) and the composition of Comparative Example 2 (containing silica modified with amino silane that included only one nitrogen atom) had problems of deterioration in flatness and polishing rate of the insulating layer. The composition of Comparative Example 3 (containing silica modified with amino silane that included only two nitrogen atoms) had a problem of deterioration in flatness. The composition of Comparative Example 4 (containing silica modified with an amino silane that included three nitrogen atoms but was free from the oxidizing agent) had problems of deterioration in flatness and polishing rate of tungsten and the insulating layer.

By way of summation and review, in a step of polishing a metal layer, a barrier layer, and an oxide layer, a composition for polishing a tungsten pattern wafer may be used and good polishing flatness may be achieved under conditions that the metal layer and the oxide layer are polished at a suitable polishing rate.

One or more embodiments may provide a CMP slurry composition for polishing a tungsten pattern wafer, which can improve polishing rate and flatness of a tungsten pattern wafer without generating surface defects upon polishing.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A CMP slurry composition for polishing a tungsten pattern wafer, the composition comprising:
    a solvent, the solvent including a polar solvent or a non-polar solvent;
    about 0.001 wt % to about 20 wt % of an abrasive agent;
    about 0.001 wt % to about 20 wt % of an organic acid;
    about 0.001 wt % to about 10 wt % of a catalyst; and
    about 0.01 wt % to about 20 wt % of an oxidizing agent,
        all wt % being based on a total weight of the composition,
    wherein the abrasive agent includes silica modified with:
        diethylenetriaminopropyltrimethoxysilane, diethylenetriaminopropyltriethoxysilane, diethylenetriaminopropylmethyldimethoxysilane, diethylenetriaminopropylmethyldiethoxysilane, or diethylenetriaminomethylmethyldiethoxysilane,
        a cation derived from diethylenetriaminopropyltrimethoxysilane, diethylenetriaminopropyltriethoxysilane, diethylenetriaminopropylmethyldimethoxysilane, diethylenetriaminopropylmethyldiethoxysilane, or diethylenetriaminomethylmethyldiethoxysilane, or
        a salt of diethylenetriaminopropyltrimethoxysilane, diethylenetriaminopropyltriethoxysilane, diethylenetriaminopropylmethyldimethoxysilane, diethylenetriaminopropylmethyldiethoxysilane, or diethylenetriaminomethylmethyldiethoxysilane.

2. The CMP slurry composition as claimed in claim 1, wherein the abrasive agent has a positive charge on a surface thereof and has a surface potential of about 10 mV to about 60 mV.

3. The CMP slurry composition as claimed in claim 1, wherein the composition has a pH of about 3 to about 6.

4. The CMP slurry composition as claimed in claim 1, wherein the abrasive agent has an average particle diameter (D50) of about 10 nm to about 200 nm.

5. A method of polishing a tungsten pattern wafer, the method comprising polishing a tungsten pattern wafer using the CMP slurry composition as claimed in claim 1.

6. The method as claimed in claim 5, wherein the abrasive agent has a positive charge on a surface thereof and has a surface potential of about 10 mV to about 60 mV.

7. The method as claimed in claim 5, wherein the composition has a pH of about 3 to about 6.

8. The method as claimed in claim 5, wherein the abrasive agent has an average particle diameter (D50) of about 10 nm to about 200 nm.

9. A CMP slurry composition for polishing a tungsten pattern wafer, the composition comprising:
    water;
    1.5 wt % of silica modified with diethylenetriaminopropyltrimethoxysilane;
    0.03 wt % of malonic acid;
    0.15 wt % of glycine;
    001 wt % of iron nitrate; and
    0.15 wt % to 0.3 wt % of hydrogen peroxide, all wt % being based on a total weight of the composition.

* * * * *